(12) United States Patent
Yen et al.

(10) Patent No.: US 11,588,010 B2
(45) Date of Patent: Feb. 21, 2023

(54) CAPACITOR STRUCTURE

(71) Applicant: Realtek Semiconductor Corporation, Hsinchu (TW)

(72) Inventors: Hsiao-Tsung Yen, Hsinchu (TW); Hsiang-Chung Hsu, Hsinchu (TW); Han-Chang Kang, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/830,648

(22) Filed: Mar. 26, 2020

(65) Prior Publication Data
US 2021/0091173 A1 Mar. 25, 2021

(30) Foreign Application Priority Data
Sep. 20, 2019 (TW) ................. 108134118

(51) Int. Cl.
*H01L 23/522* (2006.01)
*H01L 49/02* (2006.01)
*H01L 29/94* (2006.01)
*H01L 27/08* (2006.01)
*H01L 27/07* (2006.01)

(52) U.S. Cl.
CPC .......... *H01L 28/88* (2013.01); *H01L 23/5222* (2013.01); *H01L 27/0733* (2013.01); *H01L 27/0805* (2013.01); *H01L 29/94* (2013.01)

(58) Field of Classification Search
None
See application file for complete search history.

(56) References Cited

U.S. PATENT DOCUMENTS

| | | | |
|---|---|---|---|
| 6,383,858 B1 | 5/2002 | Gupta et al. | |
| 8,860,114 B2 | 10/2014 | Yen et al. | |
| 2006/0024905 A1* | 2/2006 | He | H01L 28/86 438/396 |
| 2014/0264742 A1* | 9/2014 | Yen | H01L 28/87 257/532 |
| 2015/0236711 A1* | 8/2015 | Aruga | |
| 2019/0189608 A1* | 6/2019 | Cheng | |
| 2020/0144253 A1* | 5/2020 | Jones | |

FOREIGN PATENT DOCUMENTS

TW 201401311 A 1/2014

* cited by examiner

*Primary Examiner* — Benjamin P Sandvik
(74) *Attorney, Agent, or Firm* — Locke Lord LLP; Tim Tingkang Xia, Esq.

(57) ABSTRACT

A capacitor structure includes a first metal structure, a second metal structure, and a dielectric material. The second metal structure is disposed below the first metal structure. Each of the first metal structure and the second metal structure includes at least three conductive components. The conductive components have a fish-bone shape. The dielectric material is disposed in a plurality of isolators of the first metal structure, in a plurality of isolators of the second metal structure, and between the first metal structure and the second metal structure.

11 Claims, 12 Drawing Sheets

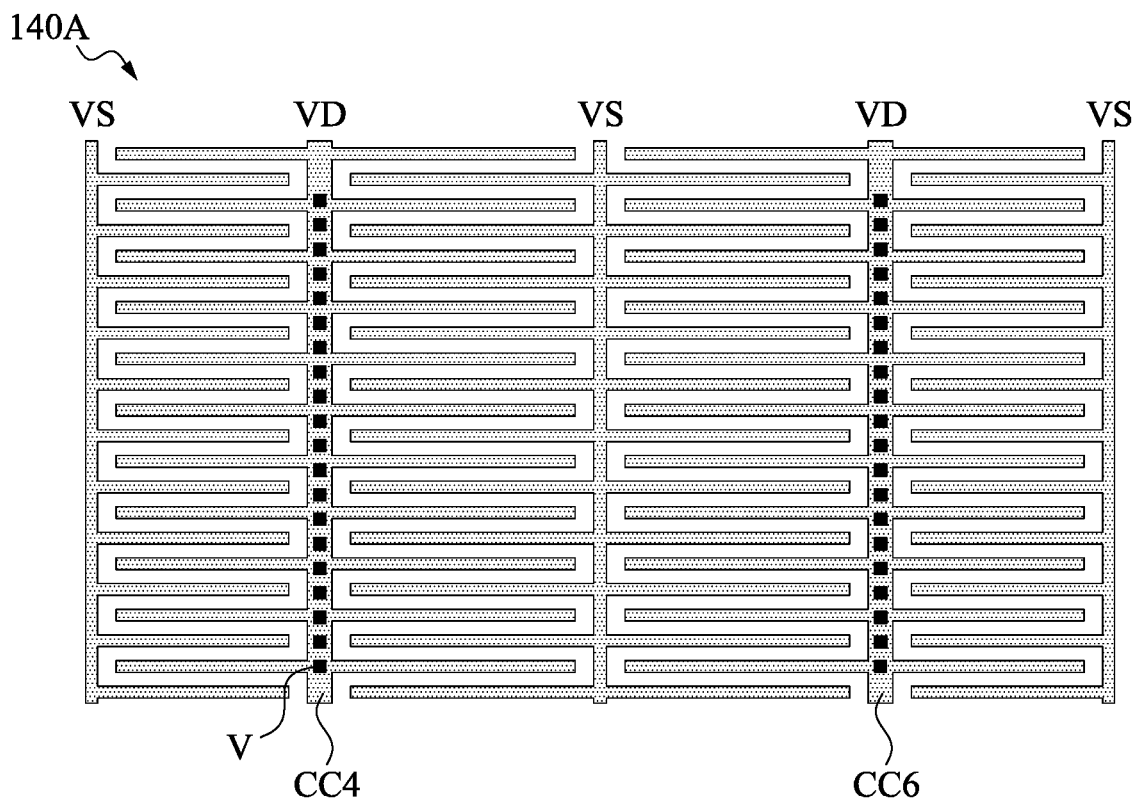
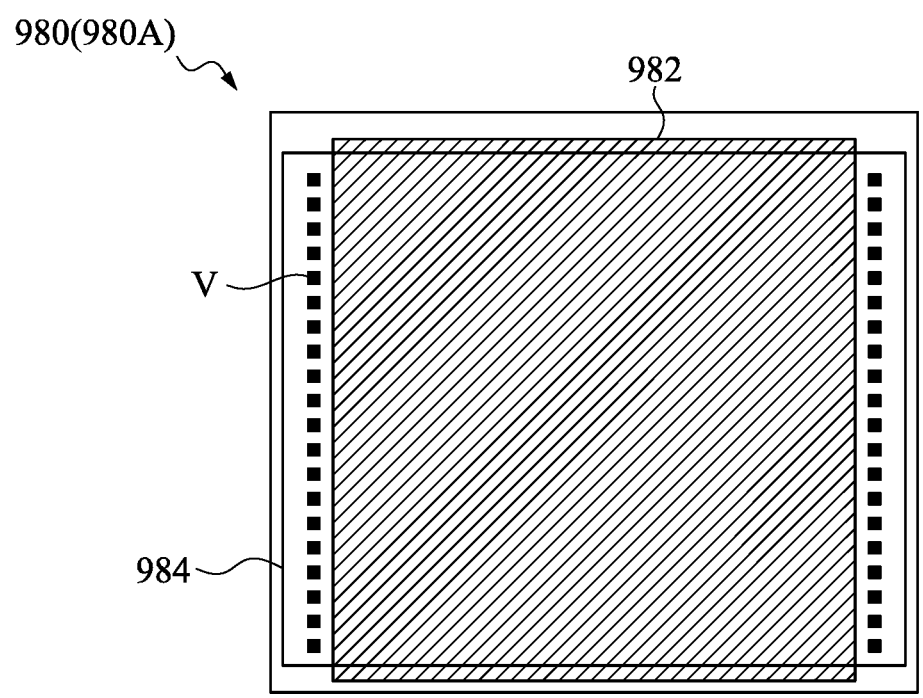
FIG. 12

CAPACITOR STRUCTURE

RELATED APPLICATIONS

This application claims priority to Taiwanese Application Serial Number 108134118, filed Sep. 20, 2019, which is herein incorporated by reference.

BACKGROUND

Technical Field

The present disclosure relates to a semiconductor technology. More particularly, the present disclosure relates to a capacitor structure.

Description of Related Art

With development of the integrated circuit (IC) technology, electrical elements in an integrated circuit become smaller and smaller. How to shrink sizes of the electrical elements or increase a density of the electrical elements is one of important issues in this field.

SUMMARY

One embodiment of the present disclosure is related to a capacitor structure. The capacitor structure includes a first metal structure, a second metal structure, and a dielectric material. The second metal structure is disposed below the first metal structure. Each of the first metal structure and the second metal structure includes at least three conductive components. The conductive components have a fish-bone shape. The dielectric material is disposed in a plurality of isolators of the first metal structure, in a plurality of isolators of the second metal structure, and between the first metal structure and the second metal structure.

One embodiment of the present disclosure is related to a capacitor structure. The capacitor structure includes a first metal structure, a second metal structure, and a dielectric material. The second metal structure is disposed below the first metal structure. Each of the first metal structure and the second metal structure includes a plurality of conductive components. A space is formed between the first metal structure and the second metal structure, and there is no connection via in the space. The dielectric material is disposed between the first metal structure and the second metal structure.

As the above embodiments, the capacitor structure of the present disclosure has a higher capacitance value. In addition, a capacitor density can be increased in the capacitor structure of the present disclosure.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 12 is an exploded diagram of FIG. 11 according to some embodiments of the present disclosure.

DETAILED DESCRIPTION

Figure 1:
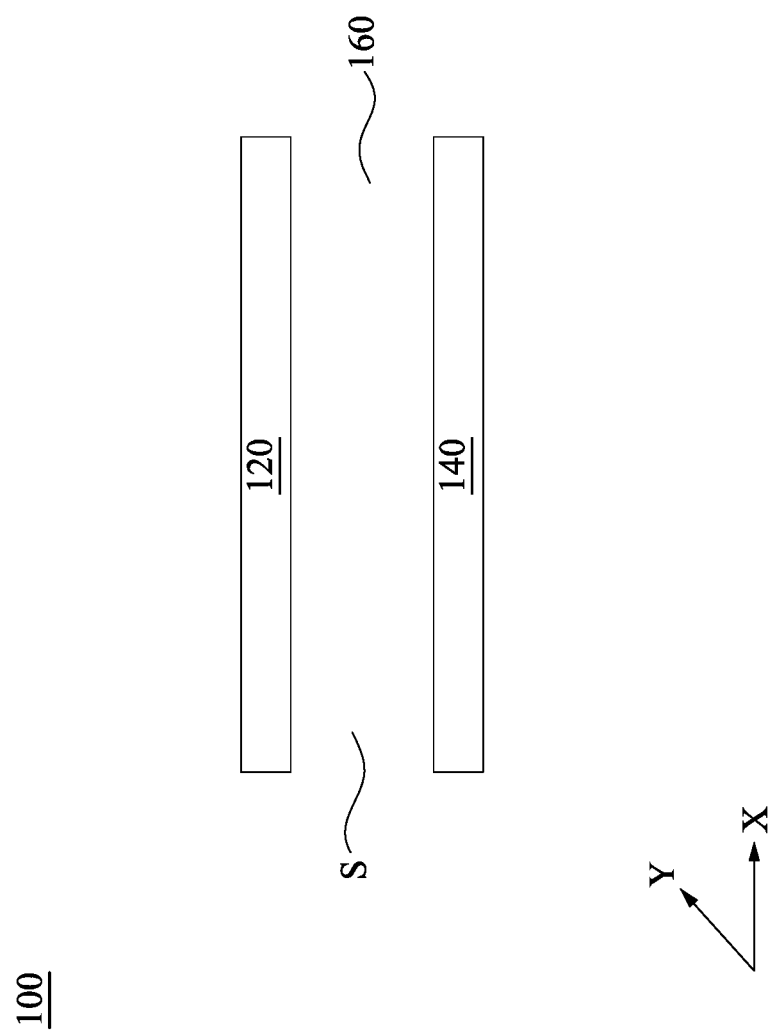
FIG. 1 is a schematic diagram illustrating a capacitor structure according to some embodiments of the present disclosure.

Reference is made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

Reference is made to FIG. 1. FIG. 1 is a schematic diagram illustrating a capacitor structure 100 according to some embodiments of the present disclosure. In some embodiments, the capacitor structure 100 is a metal-oxide-semiconductor capacitor (MOSCAP) or a metal-oxide-metal capacitor (MOMCAP).

As illustrated in FIG. 1, the capacitor structure 100 includes a metal structure 120, a metal structure 140, and a dielectric material 160. The metal structure 140 is disposed below the metal structure 120. A space S is formed between the metal structure 120 and the metal structure 140. The dielectric material 160 is disposed between the metal structure 120 and the metal structure 140 (for example, in the space S). The dielectric material 160 is, for example, $SiO_2$, but the present disclosure is not limited thereto. Various materials suitable for implementing the dielectric material 160 are within the contemplated scope of the present disclosure.

In some embodiments, one of conductive components of the metal structure 120 may be connected to one of conductive components of the metal structure 140 (for example, two conductive components having a same voltage level are connected). The connection position is disposed outside the space S. In other words, there is no connection via between the metal structure 120 and the metal structure 140. In addition, the capacitor structure 100 may be connected to another capacitor structure in a direction X and a direction Y.

Figure 2:
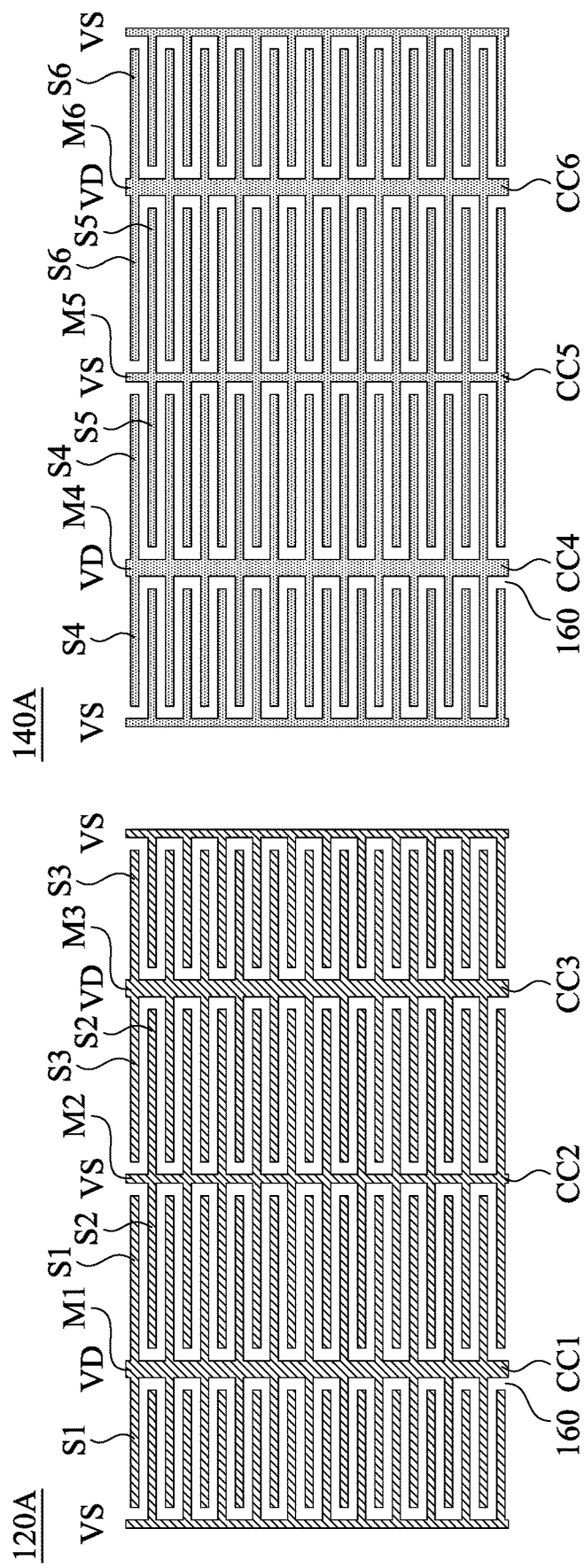
FIG. 2 is a schematic diagram illustrating two metal structures according to some embodiments of the present disclosure.

Reference is made to FIG. 2. FIG. 2 is a schematic diagram illustrating two metal structures 120A and 140A according to some embodiments of the present disclosure. In some embodiments, the metal structures 120A and 140A are configured to implement the metal structures 120 and 140 in FIG. 2 respectively.

As illustrated in FIG. 2, the metal structure 120A includes sequentially a conductive component CC1, a conductive component CC2, and a conductive component CC3. The metal structure 140A includes sequentially a conductive component CC4, a conductive component CC5, and a conductive component CC6. The conductive components CC1-CC6 have a fish-bone shape. In other words, each of the conductive components CC1-CC6 includes a main branch and a plurality of secondary branches. The conductive component CC1 and the conductive component CC2 are interlaced, and the conductive component CC2 and the conductive component CC3 are interlaced. The conductive component CC4 and the conductive component CC5 are interlaced, and the conductive component CC5 and the conductive component CC6 are interlaced. Accordingly, a plurality of isolators are formed in the secondary branches of the conductive components CC1-CC3, and a plurality of isolators are formed in the secondary branches of the conductive components CC4-CC6. In some embodiments, the isolators may be a plurality of gaps, but the present disclosure is not limited thereto. The dielectric material 160 is also disposed in these gaps.

In some embodiments, lengths of the secondary branches may be any length. In some embodiments, the lengths of the secondary branches at an upper layer may be different from the lengths of the secondary branches at a lower layer. For example, the lengths of the secondary branches of the conductive component CC1 may be not equal to the lengths of the secondary branches of the conductive component CC4.

In addition, the conductive component CC1 may be not overlapped to the conductive component CC4 in a direction Z. The conductive component CC3 may be not overlapped to the conductive component CC6 in the direction Z. Preferably, the conductive component CC1 and the conductive component CC4 are overlapped in the direction Z. The conductive component CC3 and the conductive component CC6 are overlapped in the direction Z.

In specific, the conductive component CC1 includes a main branch M1 and a plurality of secondary branches S1. The secondary branches S1 are connected to the main branch M1 and extend toward two sides of the main branch M1. The conductive component CC2 includes a main branch M2 and a plurality of secondary branches S2. The secondary branches S2 are connected to the main branch M2 and extend toward two sides of the main branch M2. The conductive component CC3 includes a main branch M3 and a plurality of secondary branches S3. The secondary branches S3 are connected to the main branch M3 and extend toward two sides of the main branch M3. The conductive component CC4 includes a main branch M4 and a plurality of secondary branches S4. The secondary branches S4 are connected to the main branch M4 and extend toward two sides of the main branch M4. The conductive component CC5 includes a main branch M5 and a plurality of secondary branches S5. The secondary branches S5 are connected to the main branch M5 and extend toward two sides of the main branch M5. The conductive component CC6 includes a main branch M6 and a plurality of secondary branches S6. The secondary branches S6 are connected to the main branch M6 and extend toward two sides of the main branch M6.

As illustrated in FIG. 2, the secondary branches S1 are aligned to the secondary branches S4 respectively. The secondary branches S2 are aligned to the secondary branches S5 respectively. The secondary branches S3 are aligned to the secondary branches S6 respectively. In other words, the metal structure 120A is a mirror image of the metal structure 140A.

In some embodiments, the conductive component CC1, the conductive component CC3, the conductive component CC4, and the conductive component CC6 receive a power voltage VD. The conductive component CC2 and the conductive component CC5 receive a ground voltage VS.

Compared to other traditional capacitor structures, the capacitor structure 100 have a higher capacitance value without sacrificing the quality factor value (Q value). In addition, with the capacitor structure 100, capacitor density can be increased.

Numbers of the conductive components of the metal structure 120A or 140A mentioned above are for illustration. Various numbers are within the scope of the present disclosure. For example, the same structure may be arranged toward two sides of the metal structure 120A or 140A such that the metal structure 120A or 140A includes more conductive components.

Figure 3:
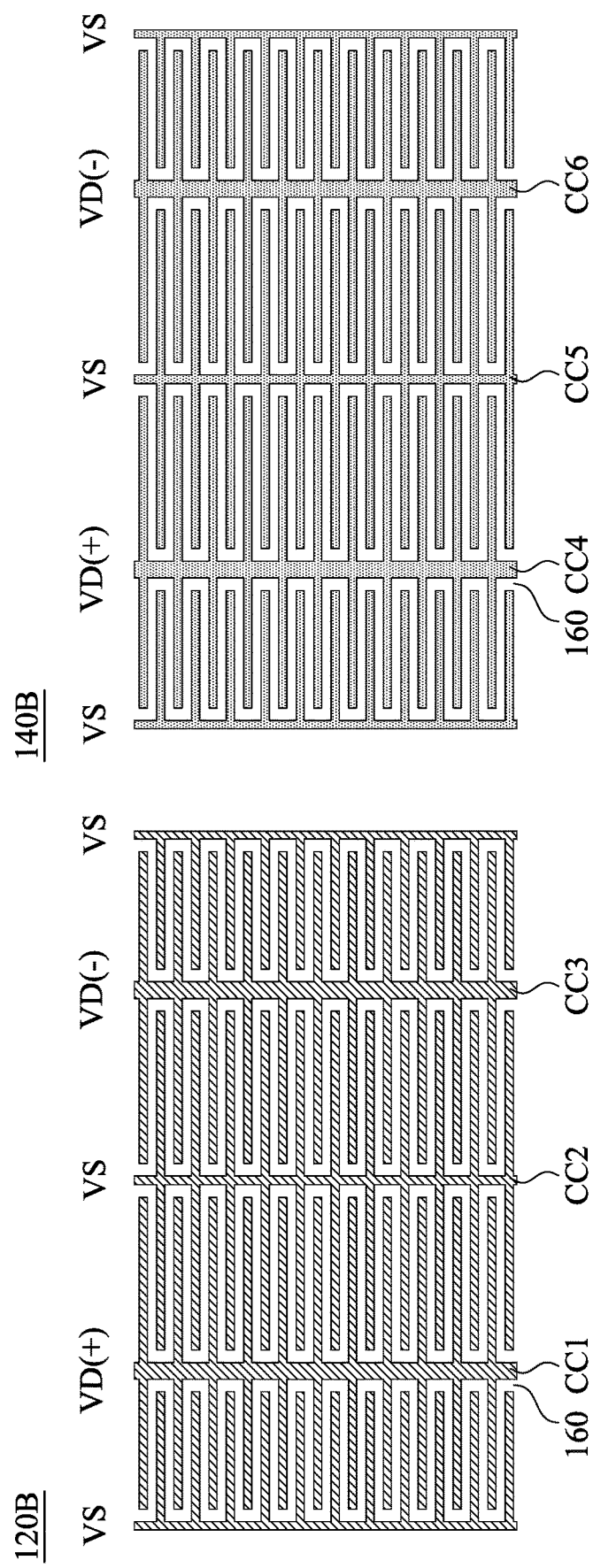
FIG. 3 is a schematic diagram illustrating two metal structures according to some embodiments of the present disclosure.

Reference is made to FIG. 3. FIG. 3 is a schematic diagram illustrating two metal structures 120B and 140B according to some embodiments of the present disclosure. In some embodiments, the metal structures 120B and 140B are configured to implement the metal structures 120 and 140 in FIG. 2 respectively. For ease of understanding, with respect to the embodiments of FIG. 2, like elements in FIG. 3 are designated with the same reference numbers. Only differences between FIG. 3 and FIG. 2 are described in following paragraphs.

As illustrated in FIG. 3, the conductive component CC1 and the conductive component CC4 receive a power voltage VD(+). The conductive component CC2 and the conductive component CC5 receive the ground voltage VS. The conductive component CC3 and the conductive component CC6 receive a power voltage VD(−). The power voltage VD(+) is a positive voltage and the power voltage VD(−) is a negative voltage. Accordingly, the metal structures 120B and 140B may be applied to an integrated circuit with differential signals. By disposing a capacitor structure having the metal structures 120B and 140B in an integrated circuit with differential signals, saving an area of the integrated circuit can be achieved.

Figure 4:
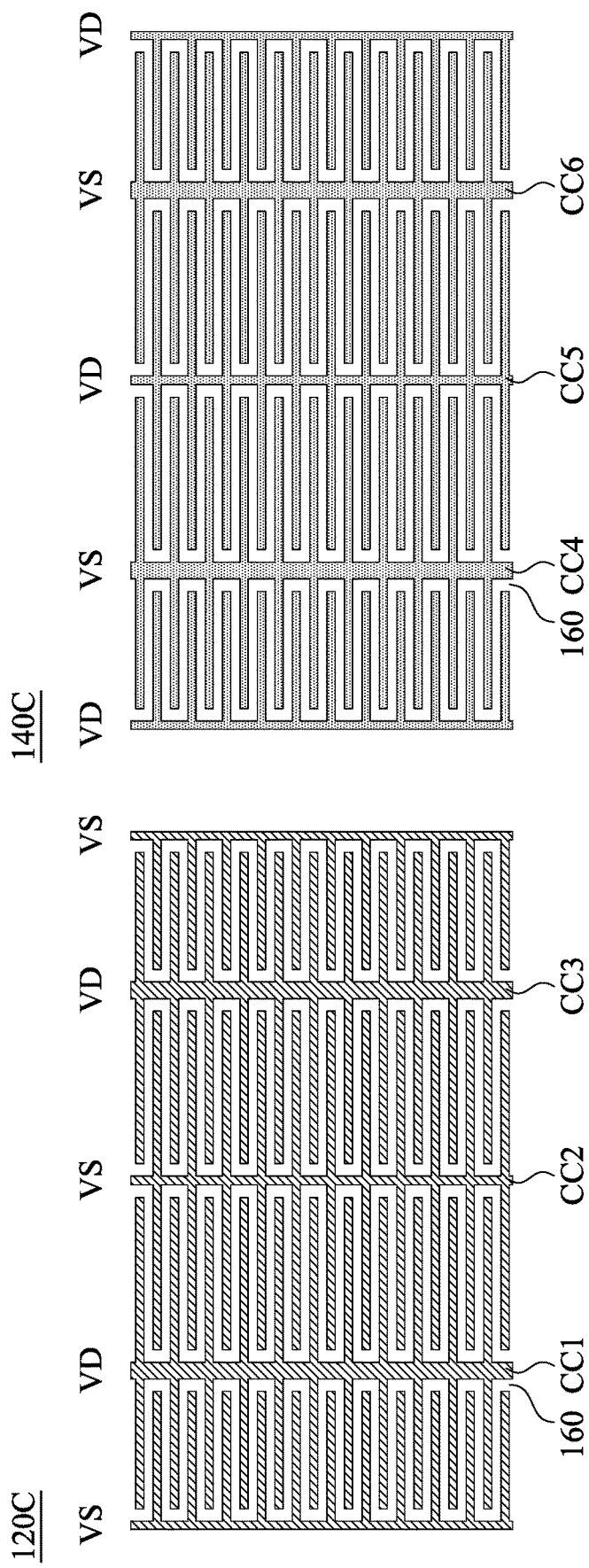
FIG. 4 is a schematic diagram illustrating two metal structures according to some embodiments of the present disclosure.

Reference is made to FIG. 4. FIG. 4 is a schematic diagram illustrating two metal structures 120C and 140C according to some embodiments of the present disclosure. In some embodiments, the metal structures 120C and 140C are configured to implement the metal structures 120 and 140 in FIG. 2 respectively. For ease of understanding, with respect to the embodiments of FIG. 2, like elements in FIG. 4 are designated with the same reference numbers. Only differences between FIG. 4 and FIG. 2 are described in following paragraphs.

As illustrated in FIG. 4, the conductive component CC1, the conductive component CC3, and the conductive component CC5 receive the power voltage VD. The conductive component CC2, the conductive component CC4, and the conductive component CC6 receive the ground voltage VS.

Figure 5:
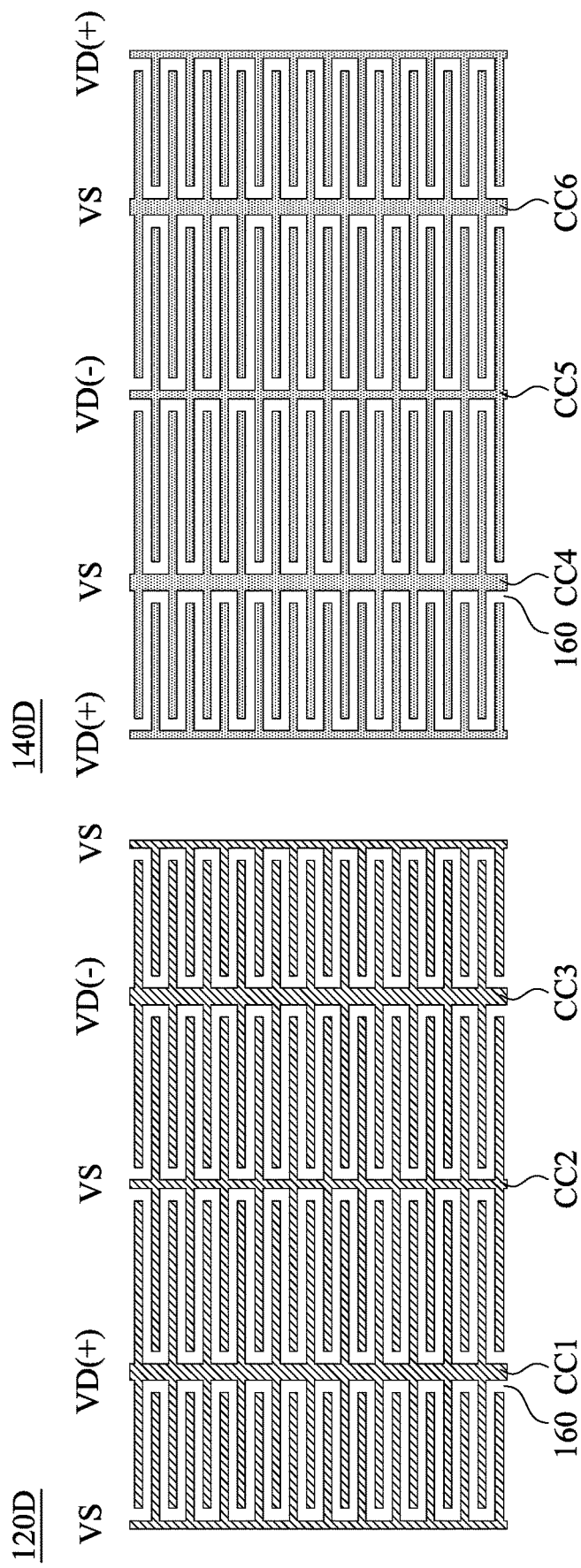
FIG. 5 is a schematic diagram illustrating two metal structures according to some embodiments of the present disclosure.

Reference is made to FIG. 5. FIG. 5 is a schematic diagram illustrating two metal structures 120D and 140D according to some embodiments of the present disclosure. In some embodiments, the metal structures 120D and 140D are configured to implement the metal structures 120 and 140 in FIG. 2 respectively. For ease of understanding, with respect to the embodiments of FIG. 4, like elements in FIG. 5 are designated with the same reference numbers. Only differences between FIG. 5 and FIG. 4 are described in following paragraphs.

As illustrated in FIG. 5, the conductive component CC1 receives the power voltage VD(+). The conductive component CC2, the conductive component CC4, and the conductive component CC6 receive the ground voltage VS. The conductive component CC3 and the conductive component CC5 receive the power voltage VD(−). The power voltage VD(+) is a positive voltage and the power voltage VD(−) is a negative voltage. Accordingly, the metal structures 120D and 140D may be applied to an integrated circuit with differential signals. By disposing a capacitor structure having the metal structures 120B and 140B in an integrated circuit with differential signals, saving an area of the integrated circuit can be achieved.

Figure 6:
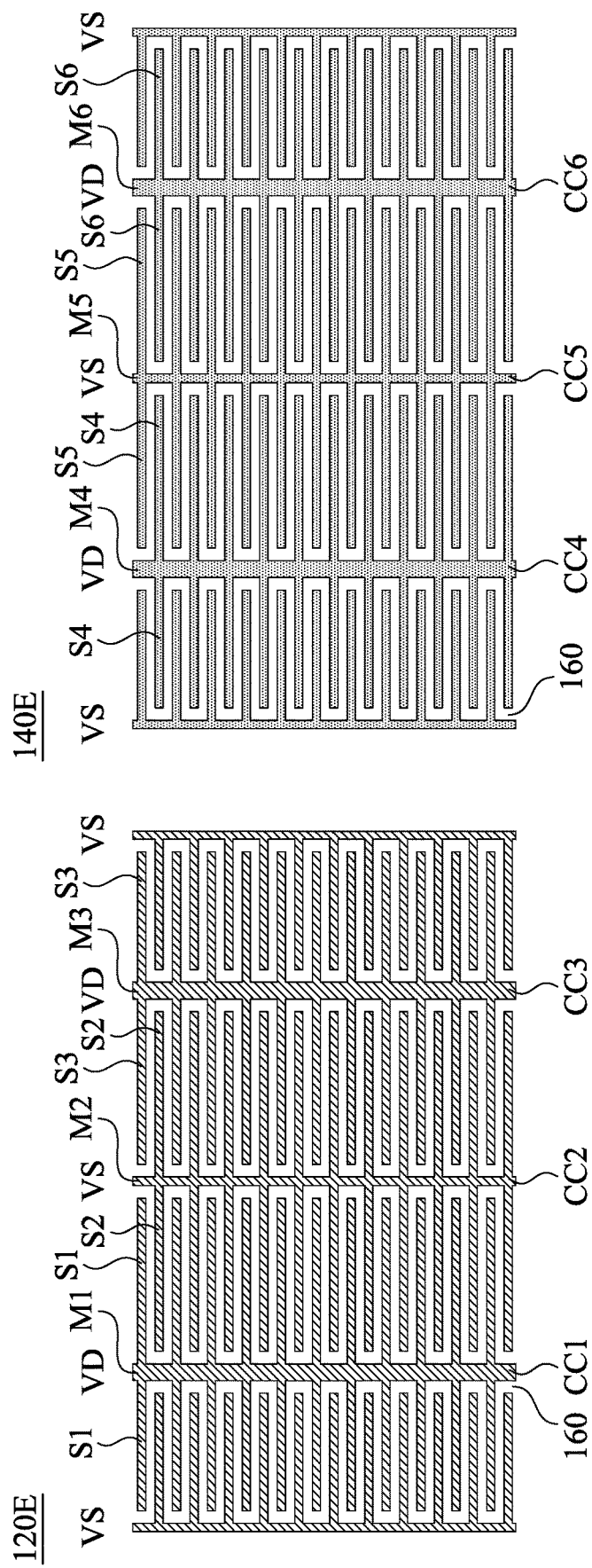
FIG. 6 is a schematic diagram illustrating two metal structures according to some embodiments of the present disclosure.

Reference is made to FIG. 6. FIG. 6 is a schematic diagram illustrating two metal structures 120E and 140E according to some embodiments of the present disclosure. In some embodiments, the metal structures 120E and 140E are configured to implement the metal structures 120 and 140 in FIG. 2 respectively. For ease of understanding, with respect to the embodiments of FIG. 2, like elements in FIG. 6 are designated with the same reference numbers. Only differences between FIG. 6 and FIG. 2 are described in following paragraphs.

As illustrated in FIG. 6, a part of the secondary branches S1 (the secondary branches S1 extending right from the main branch M1) are aligned to a part of the secondary branches S5 (the secondary branches S5 extending left from the main branch M5) respectively. A part of the secondary branches S2 (the secondary branches S2 extending left from the main branch M2) are aligned to a part of the secondary branches S4 (the secondary branches S4 extending right from the main branch M4) respectively, and another part of the secondary branches S2 (the secondary branches S2 extending right from the main branch M2) are aligned to a part of the secondary branches S6 (the secondary branches S6 extending left from the main branch M6). A part of the secondary branches S3 (the secondary branches S3 extending left from the main branch M1) are aligned to another part of the secondary branches S5 (the secondary branches S5 extending right from the main branch M5) respectively.

In some embodiments, the conductive component CC1, the conductive component CC3, the conductive component CC4, and the conductive component CC6 receive power voltage VD. The conductive component CC2 and the conductive component CC5 receive ground voltage VS.

Figure 7:
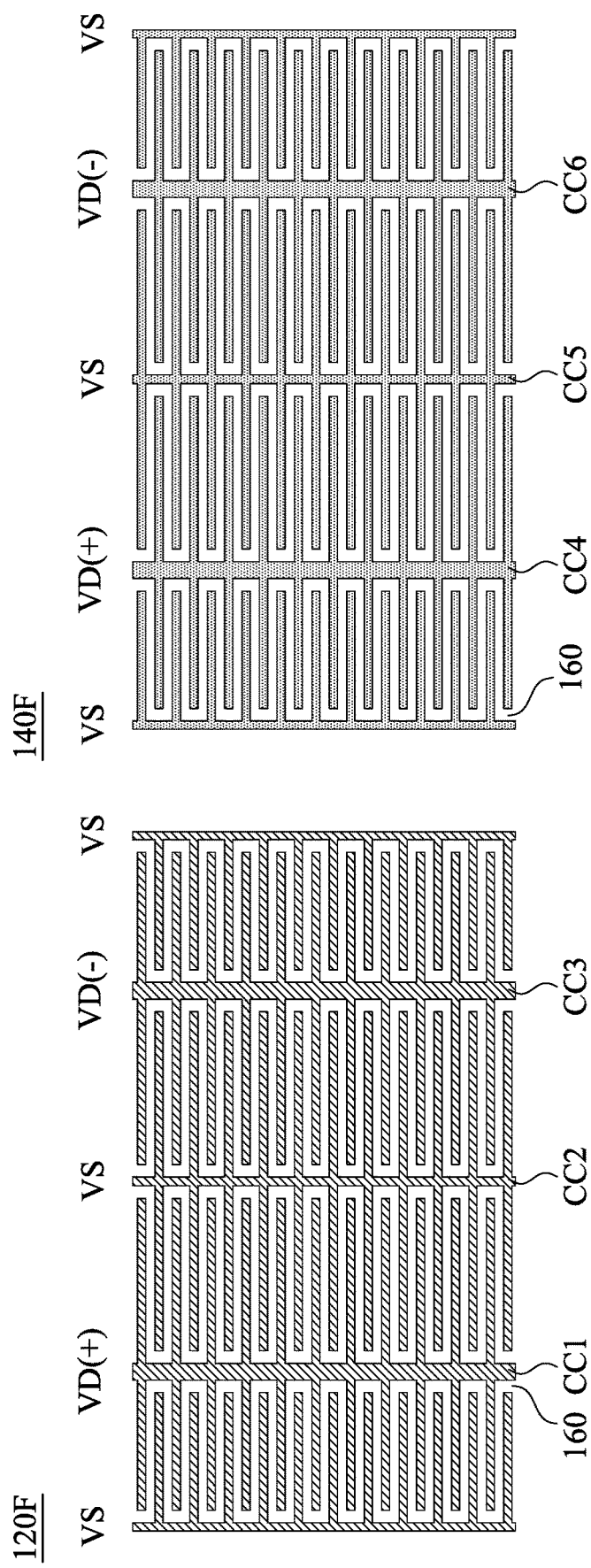
FIG. 7 is a schematic diagram illustrating two metal structures according to some embodiments of the present disclosure.

Reference is made to FIG. 7. FIG. 7 is a schematic diagram illustrating two metal structures 120F and 140F according to some embodiments of the present disclosure. In some embodiments, the metal structures 120F and 140F are configured to implement the metal structures 120 and 140 in FIG. 2 respectively. For ease of understanding, with respect to the embodiments of FIG. 6, like elements in FIG. 7 are designated with the same reference numbers. Only differences between FIG. 7 and FIG. 6 are described in following paragraphs.

As illustrated in FIG. 7, the conductive component CC1 and the conductive component CC4 receive the power voltage VD(+). The conductive component CC2 and the conductive component CC5 receive the ground voltage VS. The conductive component CC3 and the conductive component CC6 receive the power voltage VD(−). The power voltage VD(+) is a positive voltage and the power voltage VD(−) is a negative voltage. Accordingly, the metal structures 120F and 140F may be applied to an integrated circuit with differential signals. By disposing a capacitor structure having the metal structures 120F and 140F in an integrated circuit with differential signals, saving an area of the integrated circuit can be achieved.

Figure 8:
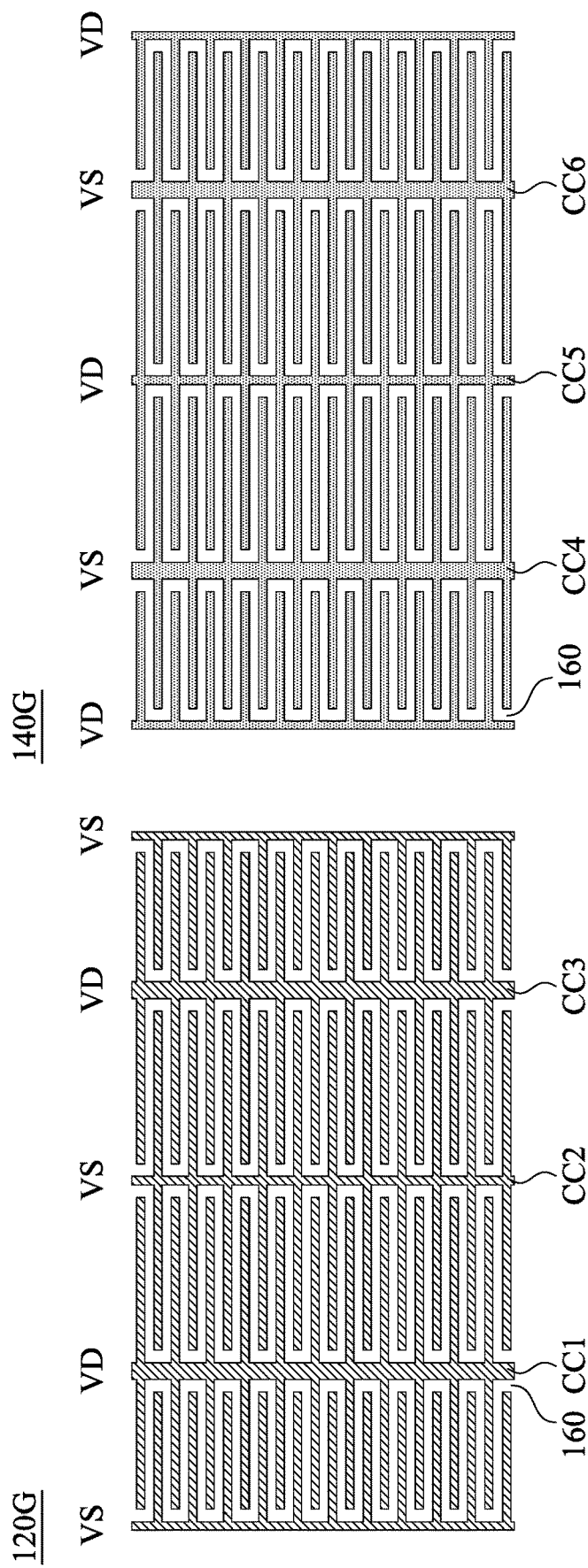
FIG. 8 is a schematic diagram illustrating two metal structures according to some embodiments of the present disclosure.

Reference is made to FIG. 8. FIG. 8 is a schematic diagram illustrating two metal structures 120G and 140G according to some embodiments of the present disclosure. In some embodiments, the metal structures 120G and 140G are configured to implement the metal structures 120 and 140 in FIG. 2 respectively. For ease of understanding, with respect to the embodiments of FIG. 6, like elements in FIG. 8 are designated with the same reference numbers. Only differences between FIG. 8 and FIG. 6 are described in following paragraphs.

As illustrated in FIG. 8, the conductive component CC1, the conductive component CC3, and the conductive component CC5 receive the power voltage VD. The conductive component CC2, the conductive component CC4, and the conductive component CC6 receive the ground voltage VS.

Figure 9:
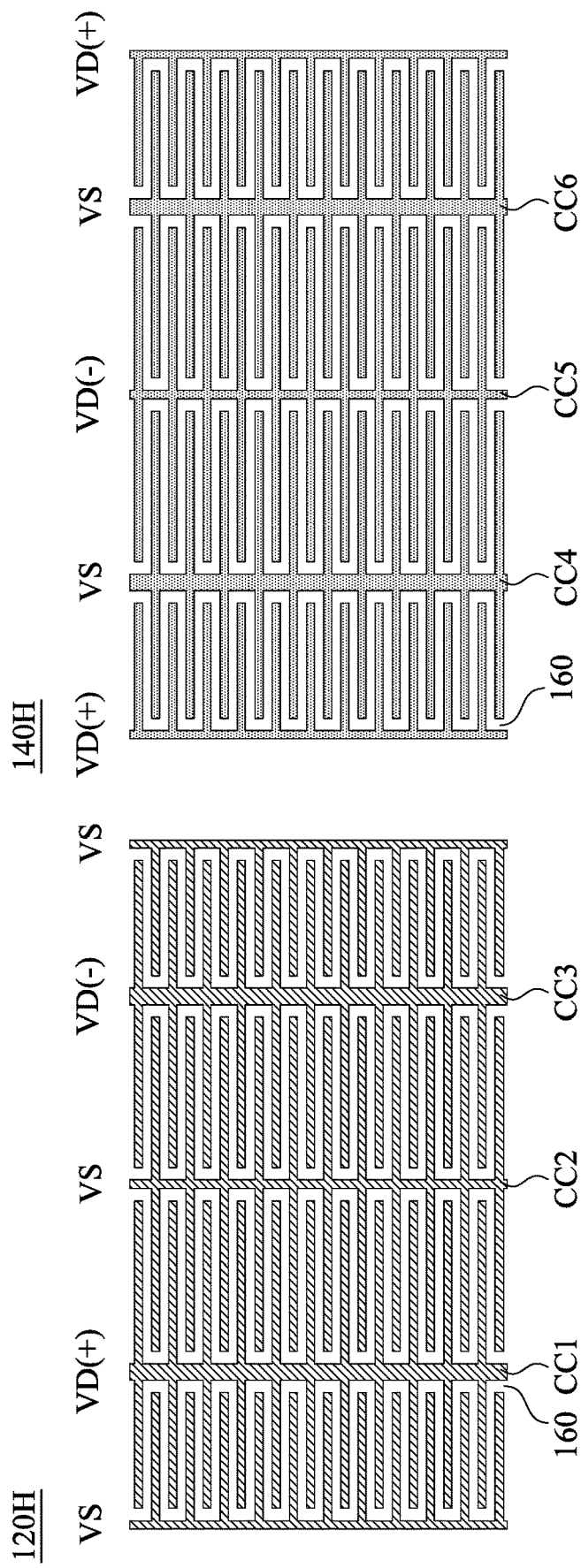
FIG. 9 is a schematic diagram illustrating two metal structures according to some embodiments of the present disclosure.

Reference is made to FIG. 9. FIG. 9 is a schematic diagram illustrating two metal structures 120H and 140H according to some embodiments of the present disclosure. In some embodiments, the metal structures 120H and 140H are configured to implement the metal structures 120 and 140 in FIG. 2 respectively. For ease of understanding, with respect to the embodiments of FIG. 8, like elements in FIG. 9 are designated with the same reference numbers. Only differences between FIG. 9 and FIG. 8 are described in following paragraphs.

As illustrated in FIG. 9, the conductive component CC1 receives the power voltage VD(+). The conductive component CC2, the conductive component CC4, and the conductive component CC6 receive ground voltage VS. The conductive component CC3 and the conductive component CC5 receive the power voltage VD(−). The power voltage VD(+) is a positive voltage, and the power voltage VD(−) is a negative voltage. Accordingly, the metal structures 120H and 140H may be applied to an integrated circuit with differential signals. By disposing a capacitor structure having the metal structures 120H and 140H in an integrated circuit with differential signals, saving an area of the integrated circuit can be achieved.

Figure 10:
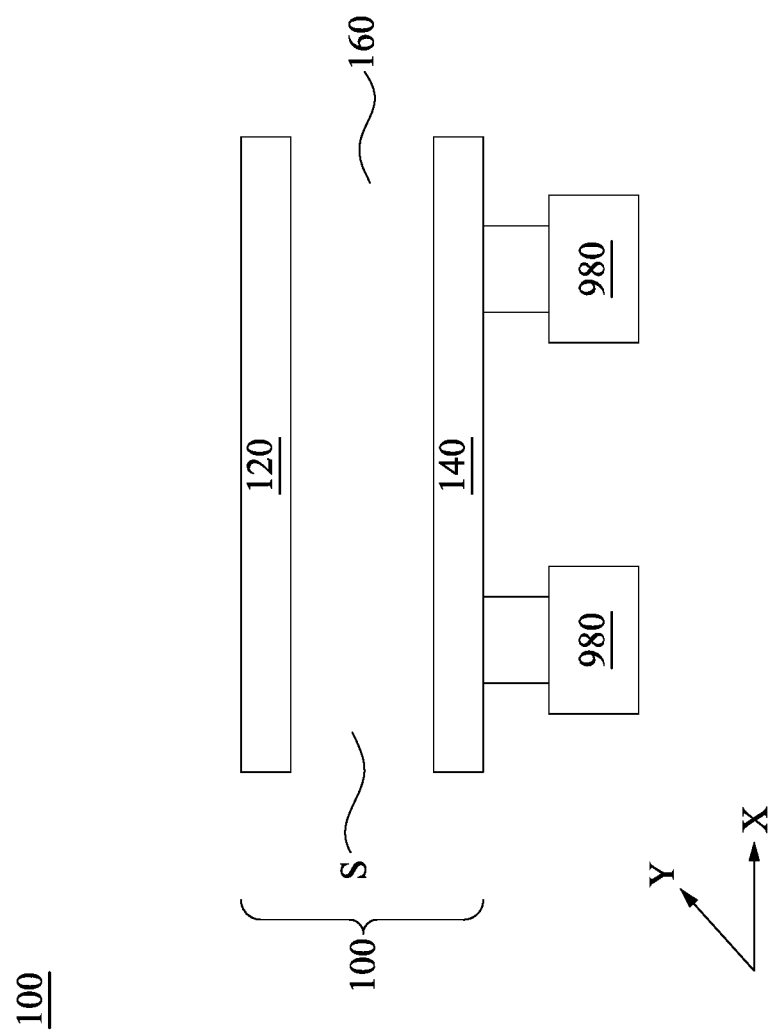
FIG. 10 is a schematic diagram illustrating a capacitor structure and electrical devices according to some embodiments of the present disclosure.

Reference is made to FIG. 10. FIG. 10 is a schematic diagram illustrating the capacitor structure 100 and electrical devices 980 according to some embodiments of the present disclosure. In some embodiments, the electrical devices 980 are transistors or MOSCAPs. As illustrated in FIG. 10, the capacitor structure 100 is disposed on the electrical devices 980 and electrically connected to the electrical devices 980. Based on design rules of the circuit design, two transistors could not be too close with each other. However, by disposing the capacitor structure 100 having a high capacitor density, the capacitor structure 100 may be electrically connected to the electrical devices 980 (for example, the transistors 980) which are not disposed next to each other.

Figure 11:
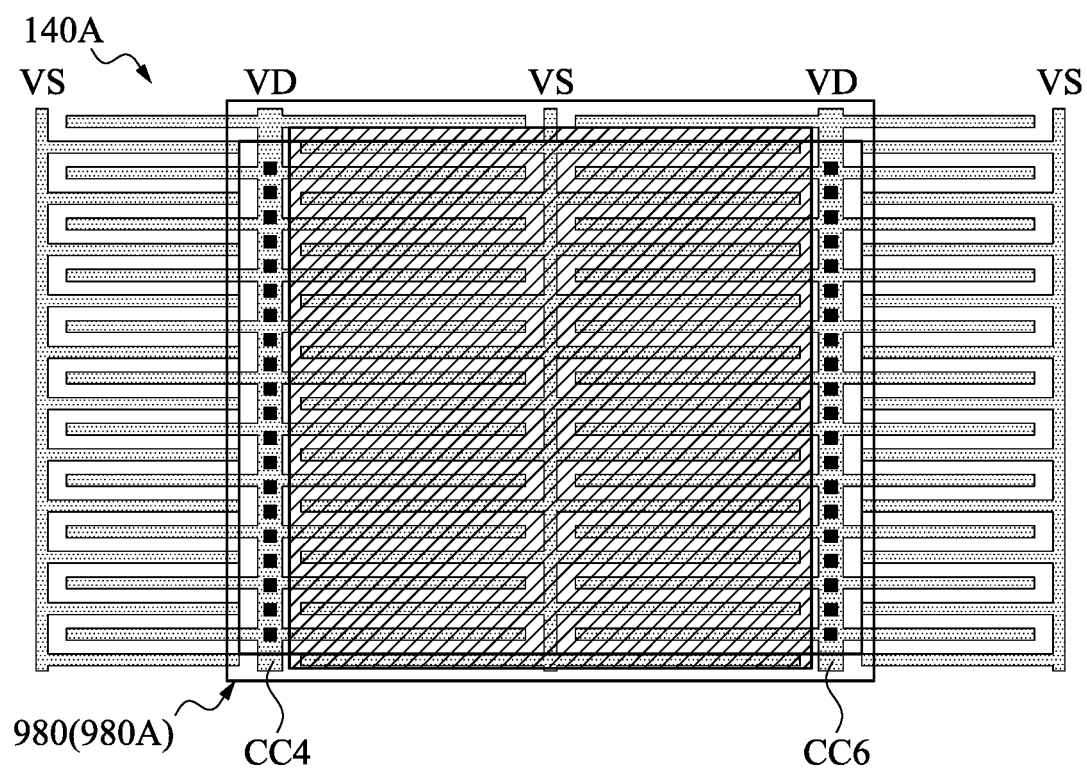
FIG. 11 is a top view illustrating a capacitor structure and electrical devices according to some embodiments of the present disclosure.

References are made to FIG. 11 and FIG. 12. FIG. 11 is a top view illustrating a capacitor structure and electrical devices according to some embodiments of the present disclosure. FIG. 12 is an exploded diagram of FIG. 11 according to some embodiments of the present disclosure. In this example, the capacitor structure in FIG. 2 is taken as an example of the capacitor structure in FIG. 11, and a MOSFET 980A is taken as an example of one of the transistors 980. For the purpose of simplicity, FIG. 11 and FIG. 12 only illustrate the metal structure 140A in FIG. 2. The metal structure 120A in FIG. 2 is omitted. The MOSFET 980A includes a poly silicon structure 982 and an oxide defined (OD) structure 984. The poly silicon structure 982 may be implemented as a gate terminal. The oxide defined structure 984 may be implemented as one of a source terminal and a drain terminal. The conductive component CC4 and the conductive component CC6 of the metal structure 140A are connected to the oxide defined structure 984 through a connection via V. The connection positions are at two-side portions of the poly silicon structure 982. In other words, the connection positions are at portions of the oxide defined structure 984, and the portions are not overlapped with the poly silicon structure 982.

As the above embodiments, the capacitor structure of the present disclosure has a higher capacitance value. In addition, a capacitor density can be increased in the capacitor structure of the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A capacitor structure comprising:
   a first metal structure;
   a second metal structure disposed below the first metal structure, wherein each of the first metal structure and the second metal structure comprises at least three conductive components, wherein the conductive components have a fish-bone shape; and
   a dielectric material disposed in a plurality of isolators of the first metal structure, in a plurality of isolators of the second metal structure, and between the first metal structure and the second metal structure,
   wherein each of two conductive components of the conductive components of the second metal structure comprises a main branch and a plurality of secondary branches, the secondary branches extend toward two opposite sides of the main branch which is connected to an oxide defined structure of a transistor, and connection positions are at two-side portions of a poly silicon structure of the transistor,
   wherein the conductive components of the first metal structure comprise sequentially a first conductive component receiving a first power voltage, a second conductive component receiving a ground voltage, and a third conductive component receiving a second power voltage, wherein the first power voltage is a positive voltage and the second power voltage is a negative voltage,
   wherein the conductive components of the second metal structure comprise sequentially a fourth conductive component receiving the first power voltage, a fifth conductive component receiving the ground voltage, and a sixth conductive component receiving the second power voltage,
   wherein there is no connection via in an entire overlapping area between the first conductive component receiving the positive voltage and the fourth conductive component receiving the positive voltage.

2. The capacitor structure of claim 1, wherein each of the first conductive component, the second conductive component, the third conductive component, the fourth conductive component, the fifth conductive component, and the sixth conductive component comprises the main branch and the secondary branches.

3. The capacitor structure of claim 2, wherein the secondary branches of the first conductive component are aligned to the secondary branches of the fourth conductive component respectively, wherein the secondary branches of the second conductive component are aligned to the secondary branches of the fifth conductive component respectively, wherein the secondary branches of the third conductive component are aligned to the secondary branches of the sixth conductive component respectively.

4. The capacitor structure of claim 2, wherein a part of the secondary branches of the first conductive component are aligned to a part of the secondary branches of the fifth conductive component respectively, wherein a part of the secondary branches of the second conductive component are aligned to a part of the secondary branches of the fourth conductive component respectively, and another part of the secondary branches of the second conductive component are aligned to a part of the secondary branches of the sixth conductive component respectively, wherein a part of the secondary branches of the third conductive component are aligned to another part of the secondary branches of the fifth conductive component respectively.

5. The capacitor structure of claim 1, wherein the capacitor structure is disposed on the transistor.

6. The capacitor structure of claim 1, wherein a space is formed by the first metal structure and the second metal structure, and there is no connection via in the space.

7. A capacitor structure comprising:
   a first metal structure;
   a second metal structure disposed below the first metal structure, wherein each of the first metal structure and the second metal structure comprises a plurality of conductive components, wherein a space is formed between the first metal structure and the second metal structure, and there is no connection via in the space; and
   a dielectric material disposed between the first metal structure and the second metal structure,
   wherein each of two conductive components of the conductive components of the second metal structure comprises a main branch and a plurality of secondary branches, the secondary branches extend toward two opposite sides of the main branch which is connected to an oxide defined structure of a transistor, and connection positions are at two-side portions of a poly silicon structure of the transistor,
   wherein the conductive components of the first metal structure comprise sequentially a first conductive component receiving a first power voltage, a second conductive component receiving a ground voltage, and a third conductive component receiving a second power voltage, wherein the first power voltage is a positive voltage and the second power voltage is a negative voltage, wherein the conductive components of the second metal structure comprise sequentially a fourth conductive component receiving the first power voltage, a fifth conductive component receiving the ground voltage, and a sixth conductive component receiving the second power voltage, wherein there is no connection via in an entire overlapping area between the first conductive component receiving the positive voltage and the fourth conductive component receiving the positive voltage.

8. The capacitor structure of claim 7, wherein each of the first conductive component, the second conductive component, the third conductive component, the fourth conductive component, the fifth conductive component, and the sixth conductive component comprises the main branch and the secondary branches.

9. The capacitor structure of claim 8, wherein the secondary branches of the first conductive component are aligned to the secondary branches of the fourth conductive component respectively, wherein the secondary branches of the second conductive component are aligned to the secondary branches of the fifth conductive component respectively, wherein the secondary branches of the third conductive component are aligned to the secondary branches of the sixth conductive component respectively.

10. The capacitor structure of claim 8, wherein a part of the secondary branches of the first conductive component are aligned to a part of the secondary branches of the fifth conductive component respectively, wherein a part of the secondary branches of the second conductive component are aligned to a part of the secondary branches of the fourth conductive component respectively, and another part of the secondary branches of the second conductive component are aligned to a part of the secondary branches of the sixth conductive component respectively, wherein a part of the secondary branches of the third conductive component are aligned to another part of the secondary branches of the fifth conductive component respectively.

11. The capacitor structure of claim 7, wherein the capacitor structure is disposed on the transistor.

* * * * *